(12) United States Patent
Hoffnagle et al.

(10) Patent No.: US 7,875,408 B2
(45) Date of Patent: Jan. 25, 2011

(54) BLEACHABLE MATERIALS FOR LITHOGRAPHY

(75) Inventors: John A. Hoffnagle, San Jose, CA (US); David R. Medeiros, Kitchawan, NY (US); Robert D. Miller, San Jose, CA (US); Libor Vycklicky, Yorktown Heights, NY (US); Gregory M. Wallraff, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 803 days.

(21) Appl. No.: 11/698,182

(22) Filed: Jan. 25, 2007

(65) Prior Publication Data

US 2008/0182178 A1 Jul. 31, 2008

(51) Int. Cl.
*G03F 7/00* (2006.01)
*G03F 7/004* (2006.01)
*G03F 7/031* (2006.01)
*G03F 7/075* (2006.01)

(52) U.S. Cl. .......... 430/19; 430/270.1; 430/273.1; 430/905; 430/945

(58) Field of Classification Search ........ 430/19, 430/270.1, 273.1, 905, 945
See application file for complete search history.

(56) References Cited

U.S. PATENT DOCUMENTS

| | | | |
|---|---|---|---|
| 4,485,168 A * | 11/1984 | Arakawa et al. | 430/345 |
| 4,491,628 A | 1/1985 | Ito et al. | 430/176 |
| 4,587,205 A | 5/1986 | Harrah et al. | 430/326 |
| 4,588,801 A | 5/1986 | Harrah et al. | 528/33 |
| 4,677,049 A | 6/1987 | Griffing et al. | 430/339 |
| 4,702,996 A | 10/1987 | Griffing et al. | 430/325 |
| 4,761,464 A | 8/1988 | Zeigler | 528/30 |
| 4,820,788 A | 4/1989 | Zeigler | 528/33 |
| 4,859,789 A | 8/1989 | Griffing et al. | 560/35 |
| 4,871,646 A | 10/1989 | Hayase et al. | 430/192 |
| 4,942,113 A | 7/1990 | Trundle | 430/326 |
| 4,990,665 A | 2/1991 | Griffing et al. | 564/265 |
| 5,039,593 A | 8/1991 | Zeigler | 430/313 |
| 5,108,874 A | 4/1992 | Griffing et al. | 430/273.1 |
| 5,128,230 A | 7/1992 | Templeton et al. | 430/191 |
| 5,391,442 A | 2/1995 | Tsushima et al. | 430/7 |
| 5,627,006 A | 5/1997 | Urano et al. | 430/192 |
| 5,776,764 A | 7/1998 | Ueta et al. | 430/270.1 |
| 6,025,117 A | 2/2000 | Nakano et al. | 430/314 |
| 6,054,254 A | 4/2000 | Sato et al. | 430/322 |
| 6,228,552 B1 | 5/2001 | Okino et al. | 430/176 |
| 6,274,288 B1 | 8/2001 | Kewitsch et al. | 430/270.14 |
| 6,291,110 B1 | 9/2001 | Cooper et al. | 430/5 |
| 6,294,313 B1 * | 9/2001 | Kobayashi et al. | 430/302 |
| 6,387,593 B1 | 5/2002 | Kewitsch et al. | 430/290 |
| 6,586,156 B2 | 7/2003 | Angelopoulos et al. | 430/270.1 |
| 6,770,417 B2 | 8/2004 | Nozaki et al. | 430/339 |
| 6,787,289 B2 * | 9/2004 | Yamada et al. | 430/281.1 |
| 6,887,665 B2 | 5/2005 | Trulson et al. | 435/6 |
| 7,008,749 B2 | 3/2006 | Gonsalves | 436/270.1 |
| 7,002,452 B2 | 4/2006 | Lu | 430/156 |
| 7,022,452 B2 * | 4/2006 | Lu | 430/156 |
| 7,087,358 B2 * | 8/2006 | Nakamura | 430/270.1 |
| 7,097,791 B2 | 8/2006 | Asakawa et al. | 216/56 |
| 7,205,088 B2 * | 4/2007 | Iftime et al. | 430/270.1 |
| 7,214,456 B2 * | 5/2007 | Iftime et al. | 430/19 |
| 7,291,400 B2 * | 11/2007 | Yokochi | 428/511 |
| 7,300,727 B2 * | 11/2007 | Kazmaier et al. | 430/19 |
| 7,521,159 B2 * | 4/2009 | Iftime et al. | 430/19 |
| 2004/0152011 A1 | 8/2004 | Chen et al. | 430/270.1 |
| 2005/0064347 A1 | 3/2005 | Wang | 430/322 |
| 2005/0250052 A1 * | 11/2005 | Nguyen | 430/322 |
| 2007/0072110 A1 * | 3/2007 | Iftime et al. | 430/270.1 |
| 2007/0105043 A1 * | 5/2007 | Elian et al. | 430/270.1 |

\* cited by examiner

*Primary Examiner*—Amanda C. Walke
(74) *Attorney, Agent, or Firm*—Robert J. Eichelburg; The Law Offices of Robert J. Eichelburg

(57) ABSTRACT

Compositions comprising photobleachable organic materials can be bleached by 193 nm light, and brought back to their Dependence of transmittance of Hex2Si and CyMeSi on delivered dose of 193 nm light.

original state by stimuli after exposure. (reversible photobleaching). We use these compositions in art-known contrast enhancement layers and as a part of a photoresist, especially in optical lithography processes for semiconductor fabrication. They may comprise polymers such as organosilicon polymers, polymers comprising polymers of aromatic hydroxyl compounds such as phenol and naphthol such as phenol formaldehyde polymers and naphthol formaldehyde polymers styrene polymers and phenolic acrylate polymers or cyclic materials comprising:

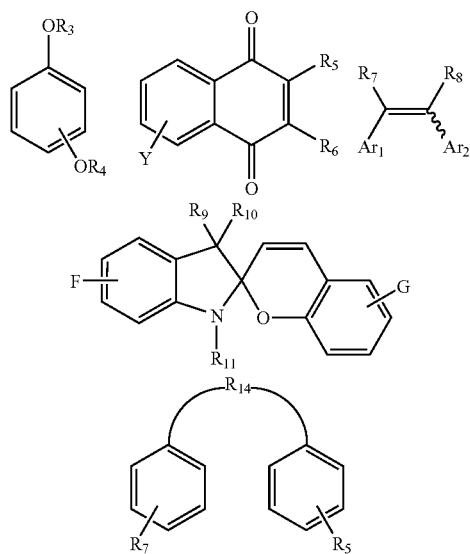

-continued

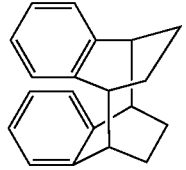

I

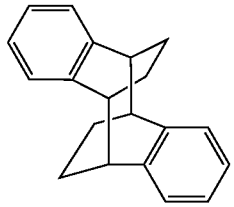

II

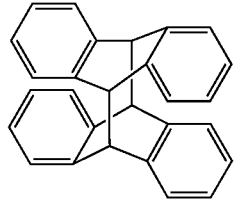

III where the radicals "R" and "Y" represent organo, or substituted organo moieties, Structures I, II, and III represent basic organic skeletons and can be unsubstituted or substituted in any available position with any one or combinations of multiple substituents.

26 Claims, 1 Drawing Sheet

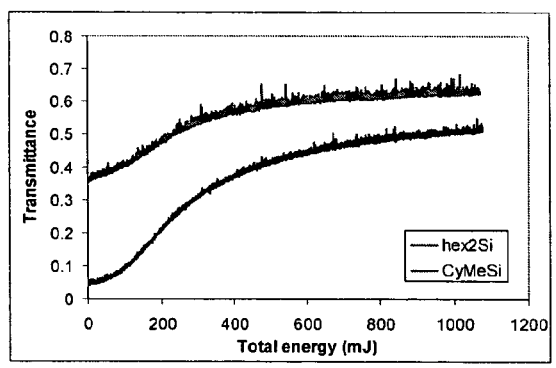
Figure
Dependence of transmittance of Hex2Si and CyMeSi on delivered dose of 193 nm light.

BLEACHABLE MATERIALS FOR LITHOGRAPHY

FIELD OF THE INVENTION

The Field of the invention comprises photobleachable compounds and compositions of matter such as organic materials including organometallic materials that can be bleached by light having wavelength of 193 nm, and in one embodiment, which we refer to as reversible photobleaching, revert back to their original state, or can be brought back to their original state by stimuli after exposure to 193 nm light.

RELATED ART

In the chip manufacturing industry today, there is constant motivation to produce faster and cheaper devices. One of the requirements for a faster device is often achieved by fabricating smaller device features on the chip. Optical lithography is the process that usually determines how small the features can be produced. Due to increasing demands on lithographic performance, new strategies and methods have recently emerged that allow fabrication of features that are smaller in size than ¼ of the wavelength of the light used to fabricate them. Some of the methods comprise the use of contrast enhancement layers (CEL) and contrast enhancement materials (CEM), well known to those skilled in the art of optical lithography. The principles have been described by Griffing and West (IEEE Elect. Dev. Lett. 1983, EDL-4, 14). We employ these and other methods in our invention, but with new compounds and new compositions of matter.

Chen et al., U.S. Patent Application Publication US 2004/0152011A1 describe prior art CEM optical lithography processes involving the distribution of light intensity from laser light to expose a photosensitive layer, noting the exposure usually follows an Airy pattern. The width of the central peak of the Airy pattern is 1.22 $\lambda$NA, where $\lambda$ is the wavelength of the incident light and NA is the aperture of the optical system. If considered or visualized as an incident light beam passing through a CEM in combination with a photoresist, the intensity of the light at the periphery of the beam or side lobes is considerably less than the intensity at the center of the beam and only at the center of the beam or "spot," where the incident light is most intense, can the light bleach through the contrast enhancement layer (CEL).

Other parts of the Airy pattern, and especially the side lobes or the periphery get filtered out by the CEL since the light striking these side lobes is not intense enough to bleach through the CEM. Light exposes the photoresist only in the region where it is intense enough to bleach through the CEM. Therefore the resulting light width when projected as a line, for example, can be much smaller and sharper than the incident wavelength used to project the image. It is also possible to produce a light pattern with a width smaller than the Airy pattern by a process known as apodization which further increase the resolution with the help of CEM. S. R. J. Brueck, "International Trends in Applied Optics," APIE Press, 2002, pp. 85-109, reviews these techniques, sometimes referred to as sub-diffraction limit lithography.

The thin layer of material covering the photoresist or a top CEL is usually a low molecular-weight material opaque to the light and usually dispersed in a polymer matrix but it can also be a polymer itself. The opaque material prevents light from reaching the resist layer and exposing it. The advantage of using such top CEL layer is improvement of the aerial image (i.e., "Airy pattern) effectively seen by the resist and therefore improving the contrast achievable by the resist. This consequently leads to improved relief in the resist after development. In a typical approach, the CEL, however, is removed after the exposure or during the development of the resist since the transparent products cannot further perform their contrast-enhancing function. This principle has been applied to earlier generations of lithography. Suitable organic materials, however, have not been disclosed for use as CEMs using 193 nm laser light, although inorganic semiconducting particles have been proposed for this process in U.S. Pat. App. No. 20040152011.

Kim, K-S et al., Proceedings of SPIE 2006, Vol. 6153, paper 61532 H describe a photolithographic process consisting of illuminating a photographic material with 256 nm light and then monitoring the absorptions for 193 and 248 nm light. Kim, however, does not teach processes of exposing a substrate with 193 nm irradiation.

Other methods used to achieve higher resolution and feature densities also employ multiple exposures. The pattern to be printed into the resist is split into multiple sets (usually two) requiring lower spatial frequencies. These sets are then imaged using separate masks and processed subsequently on the same wafer. Using such sets of images and processes helps to defeat the diffraction limit that would otherwise not allow such features to be created. Although this method increases the resolution achievable with either current or new setups, it does so at the expense of multiplying processing operations such as coating, baking, developing and striping resists and related coatings and etching of the substrates because these have to be repeated for each set of features and for each exposure. Therefore any method that allows reuse of any of the coatings without their removal would translate into cost and time savings. But simply reusing a resist layer that had been already imaged once is not a viable option due to the additive nature of light intensities of the side lobes of the aerial image that cause degradation of the closely spaced profiles. If, however, these already-deposited side-lobe intensities could be erased, reuse of the resist would be possible. An erasable top layer has such potential.

The following references describe the need in the art to develop compositions and/or methods in the field of optical lithography using DUV (i.e. deep-ultraviolet light or light having a wavelength of from about 150 nm to about 300 nm) to expose photosensitive substrates, and especially DUV having a wavelength of about 193 nm and/or about 248 nm: U.S. Pat. Nos. 7,022,452; 6,887,665; 6,770,417; 6,387,593; 6,274,288; 6,228,552; and 4,491,628. These references generally do not specify any photobleachable materials suited for 193 nm light exposure.

SUMMARY OF THE INVENTION

The foregoing indicates a need for a novel CEL to improve the aerial image effectively seen by the photoresist and thereby improve the contrast achievable by the resist using 193 nm light to expose it. The foregoing also indicates a need for novel materials that would allow reuse of some or all of the material layers (such as the CEL or resist layer) during multiple exposure schemes.

Accordingly, the present invention addresses and overcomes these and other difficulties encountered in the related art by providing such a CEM and CEL, and compounds and compositions of mater employed in such a CEL and CEM as well as methods of using such a CEL and CEM to obtain an improved optical lithographic process for manufacturing features on the surface of an article such as a semiconductor chip where these features are a fraction of the wavelength of the light used in the optical lithographic process.

The invention comprises photobleachable compounds and compositions of matter such as organic materials including organometallic materials that can be bleached by light having wavelength of 193 nm, and in one embodiment, which we refer to as reversible photobleaching, revert back to their original state, or can be brought back to their original state by stimuli after exposure to 193 nm light. Reversible photobleaching comprises spontaneous conversion of any compound or composition of matter of the invention that is bleached by 193 nm to regain at least part or all of their initial opacity to such light. Reversible photobleaching also includes the effect obtained by application of chemical, electric, magnetic or electromagnetic stimuli to these bleached compounds or compositions of matter that will cause them to regain at least part or all of their initial opacity to such DUV light. In a further embodiment, the field of the invention comprises photolithography using multiple exposures of these compositions. These compounds and compositions of matter find use in art-known contrast enhancement layers and as a part of a photoresist in an optical lithography processes such as processes used in semiconductor fabrication.

The description that follows sets forth the features and advantages of the invention, apparent not only from this written description, but also by practicing the invention. This written description, the abstract of the disclosure, the claims and drawing as filed, or as any of the foregoing may be subsequently amended will set forth additional features and advantages of the invention, and will particularly point out the objectives and advantages of the invention, showing how they may be utilized and obtained.

To achieve these and other advantages of the invention, and in accordance with the purpose of the invention, as embodied and broadly and particularly described herein, the invention comprises compounds, compositions of matter and a photo optical process for producing features on the surface of a device such as a semiconductor device using such compounds or compositions of matter.

Here we use novel types of CEMs and CELs, i.e., compounds and/or compositions of matter that comprise organic or "organometallic," e.g., organosilicon materials that can be bleached specifically using light comprising a wavelength of 193 nm. In accord with the practice in the art, we refer to silicon as a metal in describing the organometallic materials of our invention, even though silicon is not a metallic element. In addition we use such materials which further have the characteristic of reversible bleaching in a scheme where the lithographic exposure is followed by other stimuli, such as, but not limited to, heat, light of different wavelengths, magnetic or electric fields and the like, so the material can be brought back to the original opaque state. Such regenerated CEMs or CELs can be used for the next exposure in multiple-exposure (such as double exposure) processes without the need of stripping the CEL or developing the underlying resist because the sub-threshold light intensities deposited only into the CEL are erased.

As can be seen this is highly beneficial to schemes employing multiple exposures and substantially decreases the time and costs involved in processing and fabrication of features on surfaces such as the surface of silicon semiconductor devices and equivalent semiconductor or other devices. While use of inorganic semiconducting nanoparticles has been proposed (U.S. Patent Application Publication. No. 20040152011), spectral and material properties of organic and organometallic compounds (proposed here) can be tailored more easily than prior art materials, and the materials or the photosensitive moieties of the invention can be incorporated into the monomers forming the polymer matrix. In a further aspect of our invention, we also incorporate the new bleachable materials directly into the photoresist. Methods and systems have also been proposed (U.S. Patent Application Publication. No. 20050064347). The present invention can employ the methods and systems described in this reference

BRIEF DESCRIPTION OF THE DRAWING

The accompanying drawing, incorporated in and which constitutes a part of this specification, illustrates single and multiple embodiments of the invention, and together with the other parts of the specification serves to explain the objects, advantages and principles of the invention.

In the drawing, the FIGURE comprises a graph plotting light transmittance as the ordinate, and total energy (mJ) as the abscissa to illustrate dependence of transmittance of Hex2Si (upper curve) and CyMeSi (lower curve) on delivered dose of 193 nm light. Hex2Si and CyMeSi comprise polysilane compounds of the formula

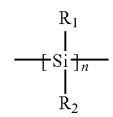

where $R_1$ is methyl and $R_2$ is cyclohexyl (CyMeSi), or both $R_1$ and $R_2$ are n-hexyl (Hex2Si).

DETAILED DESCRIPTION

Our invention comprises materials with irreversible and reversible bleaching properties which we broadly refer to as bleachable materials (BMs). These BMs comprise the following cyclic compounds and the other listed BM organic compounds that follow, or any of these BM compounds in combination with one another. We refer to these BM compounds and combinations of BM compounds as the BM compounds of the invention which can also be used with other BM compounds and/or with otherwise photochemically inactive materials or polymers and combinations thereof. These cyclic compounds comprise:

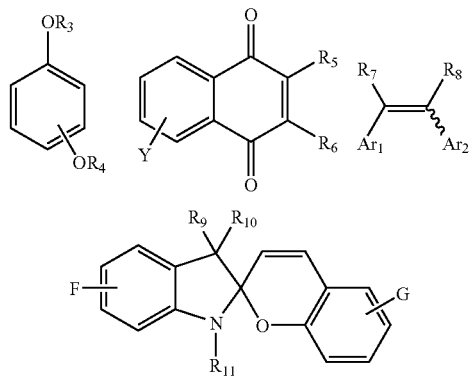

-continued

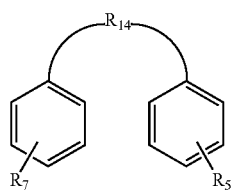

I

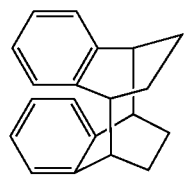

II

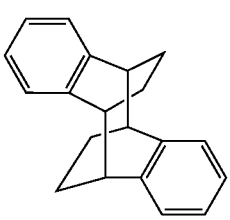

III

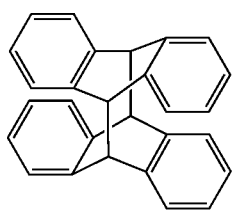

where the R and Y represent organo, or substituted organo moieties. We subsequently describe these cyclic compounds in detail.

The bleachable BMs are based on organic and organometallic materials, e.g., organic compounds that can undergo photochemical transformation including, but not limited to, photocyclizations, dipolar additions, Diels-Alder or retro-Diels-Alder-type reactions, photo-oxidations, photo-reductions, rearrangements, chain scission and other functional group transformations.

Photocyclizations and Diels-Alder-type reactions, e.g. such as in case of diarylethenes, comprise the following:

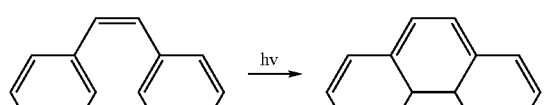

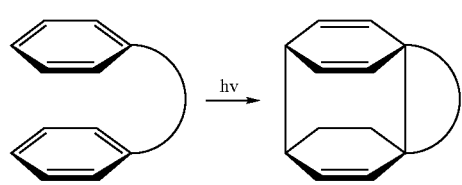

or their retro- or reverse versions, such as

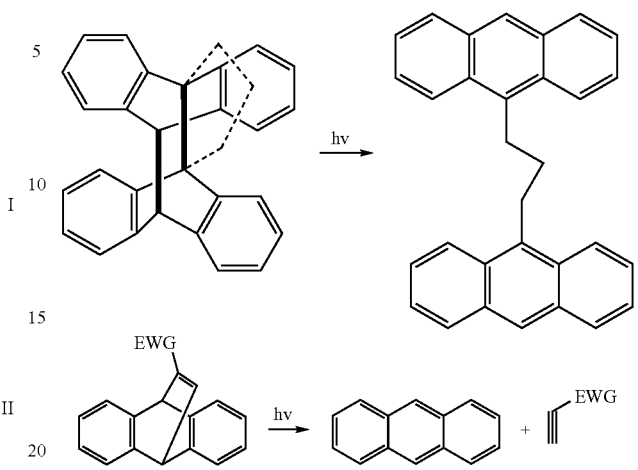

photo-oxidations, such as

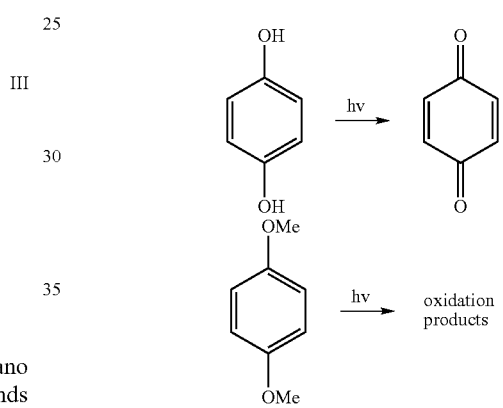

photo-reductions, such as

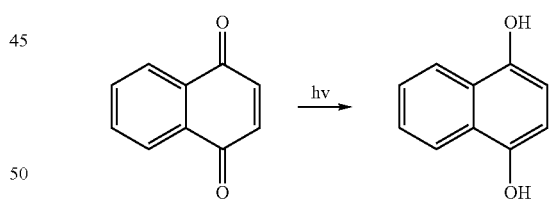

polymer chain scission, such as in case of polysilanes

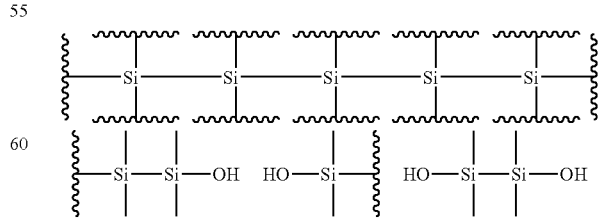

or other functional group transformations.

These reactions must be effected by the main fabrication radiation (MFR) such as 193 nm laser light. The products of the photoreaction must be more transparent to the corresponding radiation to allow exposure of the underlying resist. In case of the reversibly bleachable materials, the products of the photoreaction must either spontaneously, or after a specific stimulus, be able to completely or partially restore their opacity to the main fabrication radiation. They can do so by either converting back to achieve the chemical structure of the original material or by converting into other chemically different entities that are also opaque to the MFR and can be bleached by it again. Dill's parameters can be used to describe the optical properties of the materials.

The photobleachable compounds and compositions of matter comprising organic materials used in contrast enhancement layers or as a part of a photoresist in optical lithography and semiconductor fabrication are bleached by 193 nm light, but in some instances can be brought back to the original absorbing state by other stimuli after imaging. The other BMs, in addition to the foregoing cyclic compounds, comprise organic materials such as organo-silicon polymers, polymers comprising polymers of aromatic hydroxyl compounds such as phenol, or substituted phenol, e.g., resorcinol, and naphthol or substituted naphthol reacted with a carbonyl compound containing from one to about five carbon atoms such as an aldehyde, e.g. formaldehyde or a ketone such as acetone and comprise inter alia phenol formaldehyde polymers, resorcinol formaldehyde polymers and naphthol formaldehyde polymers or bisphenol-A-or bisphenol F type oligomers The other BMs comprising organic materials also comprise, styrene polymers and acrylate polymers with the said phenolic functionalities attached as pendant groups. The acrylate backbone itself is transparent to the 193 nm light, therefore the bleachable properties depend on what is attached to it (e.g. the phenolic groups).

These organic materials comprise either homopolymers of the above materials such as polyhydroxystyrene or oligomers thereof or copolymers or copolymer oligomers, preferably random copolymers or copolymer oligomers comprising anywhere from about 5 to about 10,000 repeating units, or from about 50 to about 1000 repeating units or from about 100 to about 500 repeating units such as in poly(hydroxystyre-co-phenylmethacrylate), poly(hydroxystyrene-co-hydroxyphenylmethacrylate) and the like. The ratio of the foregoing silicon, aromatic hydroxy materials (e.g., phenolic and naphtholic polymers and/or oligomers), styrene, and acrylate monomeric compounds to these other polymeric units, when employed is anywhere from about 1% to about 99%, or from about 10% to about 60% or from about 30% to about 50% on a molar basis. The specific preferred ratio will depend on the optical absorption and film properties required for a particular application.

The foregoing organic compounds as well as the cyclic compounds are also employed in compositions of matter that comprise photochemically inactive materials either dispersed in the photochemically inactive polymers or copolymerized with them. Such polymers comprise monomers that do not absorb the MFR. Examples of such polymers are homopolymers like polymethylmethacrylate, polymethacrylic acid, polyvinylalcohols and the like. The invention also comprises these photochemically inactive materials or polymers where the photobleachable materials are copolymerized with them such as poly(hydroxystyre-co-methylmethacrylate) or poly(hydroxystyrene-co-glycidyl methacrylate).

As noted, the cyclic compounds comprise:

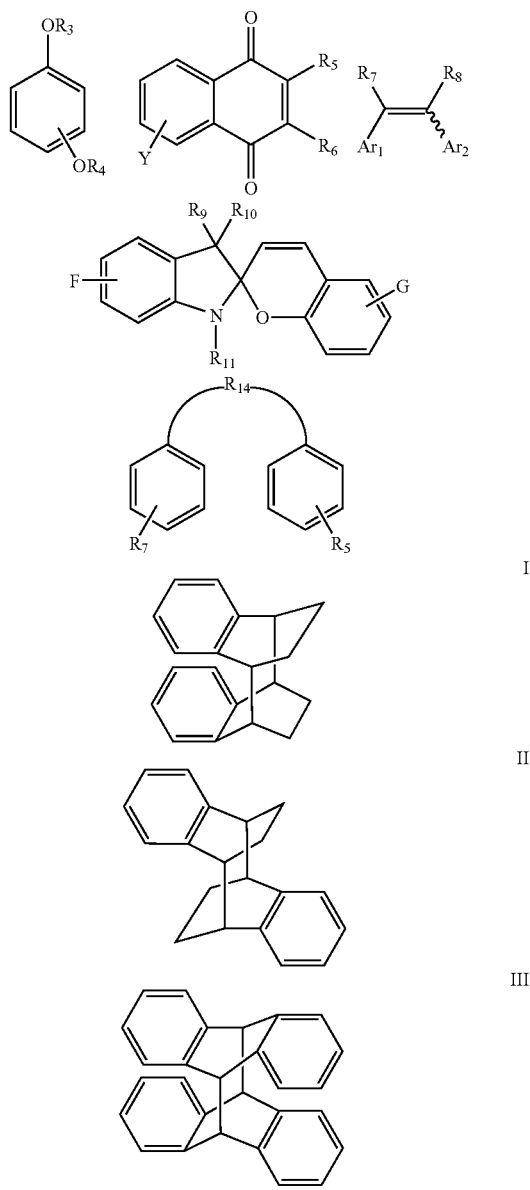

where the R and Y represent organo, or substituted organo moieties;

where $R_3$, $R_4$ represent hydrogen, alkyl, fluoroalkyl, alicyclic, aromatic, carbonyl, carboxyl and other heteroatom-containing groups and combinations thereof. As an example, $R_3$ and $R_4$ can be the same as in 1,4-dimethoxybenzene, or they can be different $R_3$ being hydrogen and $R_4$ being methyl as in 1-hydroxy-4-methoxybenzene. The can also be in different arrangement such as 1,3-dimethoxybenzene or 1,2-dimethoxybenzene;

$R_5$, $R_6$, $R_7$, $R_8$, F, G represent independently hydrogen, 1 to about nine carbon atom alkyl, fluoroalkyl, alicyclic, aromatic, alkoxyl, carbonyl, and carboxyl, or halogen and other heteroatom-containing groups such as but not limited to cyano or nitro groups and combinations thereof;

$R_9$, $R_{10}$, $R_{11}$ represent hydrogen, 1 to about 9 carbon atom alkyl, fluoroalkyl, alicyclic and aromatic groups and various combinations thereof. $R_{14}$ represents any kind of tethering group that physically connects the two aromatic rings together;

the tethering group can be comprised of 1 to about 8 methylene groups, more preferably 1 to 3 methylene groups such as in 1,3-diphenylpropane; any number can be replaced by other substituents such as carbonyl group as in 1,3-diphenyl-2-propanone;

$R_7$ and $R_8$ can also constitute a tethering group as describer for $R_{14}$. Paracyclophan is an example of a compound having $R_{14}$ and $R_7$ and $R_8$ groups in its molecule;

$Ar_1$ and $Ar_2$ represent various aromatic substituents such as but not limited to substituted or unsubstituted phenyl or thienyl; they can be arranged in cis or trans geometry around the central double bond. Substituents $R_5$ and $R_6$ as well as $R_7$ and $R_8$ can also represent a 1 to about 9 carbon atom cyclic structure annulated to the base structure depicted in the corresponding formula; structures I, II, and III represent the basic skeletons and can be substituted in any available positions with any one or combinations of multiple substituents as described for $R_3$ through $R_{14}$; they can be e.g. methyl, ethyl, methoxy, hydroxyl, trifluoromethyl and acetyl to name few; specific examples of structure III are photomers of the following compounds of 1,3-diathryl-1 propanone, 1,3-dintryl-2-propanol or 1,3-dianthryl-ethane. These photomers and other anthracene photodimers and their syntheses are well known (Becker, *Chem. Rev.* 1993, 93,145).

Cyclic compounds that have reactive substituents can be part of a monomer employed for the production of polymeric systems for the manufacture of a CEL. Those cyclic compounds that do not have reactive substituents can be converted to cyclic compounds having reactive substituents, such as alkyl hydroxy substituents or carboxyl substituents, and further reacted as part of a monomer system to form these polymeric CEL systems, as in the case of cyclic compounds that have reactive substituents. For example, the aromatic rings of the cyclic compounds allow them to be converted to alkylhydroxy substituted cyclic compounds by reaction with low molecular weight carbonyl compounds such as aldehydes or ketones in the presence of sulfuric acid and by employing mild reaction conditions. This hydroxyalkylation produces hydroxyalkyl substituents on the cyclic compounds. Hydroxyalkylation of aromatic compounds is described by March, *Advanced Organic Chemistry*, Fourth Edition, p. 548 (1992). Treating the cyclic compound having aromatic groups with diethyl oxomalonate produces an arylmalonic acid derivative (ArC(COH)(COOEt)$_2$) which can be converted into arylmalonic acid compounds by processes well known in the art. March, Id. at p. 549.

Where the substituents on the cyclic compound comprises a hydroxyl group, including an alkyl hydroxyl group, the hydroxyl substituents can be reacted with epichlorohydrin to form a glycidyl ether (an epoxy compound) which in turn can be reacted with any art-known "2-pot" or two component epoxy system to form a polymer. Additionally, where the substituents on the cyclic compound comprises a hydroxyl group, or an acid group, the hydroxyl substituents and/or the carboxylic groups can be reacted directly with an art-known "2-pot" or two component epoxy resin system to form a polymer. The hydroxy substituted cyclic compound can also be reacted with the components of a "2-pot" or two component polyurethane system comprising a diisocyanate and a diol such as a polyalkylene glycol, admixed with a tin catalyst. The hydroxy substituted cyclic compound can also be reacted with acrylic acid or methacrylic acid to form an acrylate ester which in turn can be polymerized with vinylic compounds such as styrene, acrylic acid methacrylic acid and the like such as art-known substituted acrylic acid monomers or acrylate monomers to form copolymer and terpolymer resins. The hydroxy substituted or carboxylic acid substituted cyclic compound can also be reacted with the ester components of a "2-pot" or two component polyester system comprising the reaction product of a polyhydroxy compound such as a dihydroxy compound, e.g., a compound or composition comprising a polyalkylene glycol and an unsaturated polycarboxylic acid such as a dicarboxylic acid, e.g., a compound or composition comprising maleic acid as the first or ester component, and a vinylic compound such as styrene as the second component.

The foregoing cyclic compounds or organic materials can be used with one another and/or the photochemically inactive compounds in a ratio of anywhere from about 1% to about 99%, from about 30% to about 80%, or from about 40% to about 70% of cyclic compound to organic material and/or photochemically inactive material on a weight basis, and in one instance are processed as specified herein to recover the original opacity of the top layer where reversibly bleachable material is used. Such reversibly bleachable materials comprise the cyclic compounds, optionally with any polymer; or any of the other organic compound noted herein or any other materials and combinations thereof with the exception of the polysilanes that cannot bleach reversibly due to the chemical nature of their photoconversion. Such reversibly bleachable materials may be treated by further processing, also as noted herein.

Such further processing, may involve, baking, exposure to chemicals in solution, or vapors, gases, magnetic, electric or electromagnetic field, or radiation of a wavelength(s) or type(s) different from the main fabrication radiation and combinations of such further processing conditions. The baking temperatures in this regard comprise anywhere from about 40° C. to about 250° C., between about 80° C. and about 150° C. for anywhere from about 5 seconds to about 60 minutes or about 30 seconds to about 120 seconds. The wavelengths can be anywhere from about 193 to about 800 nm, or about 248 to about 450 nm with doses anywhere from about 5 mJ/cm$^2$ to about 1 J/cm$^2$, or about 10 to about 100 mJ/cm$^2$.

One aspect of the invention comprises the composition of the BMs, designed as a monomer or a part of a monomer that, when polymerized, forms the polymer matrix or a part of it. Such BMs become an integral part of the polymer matrix which in itself becomes photobleachable. As noted previously, the BMs comprising the organic materials form the main chain of the polymers or they are incorporated as pendant side chains or portions of them. These polymers or organic materials are then used in a separate layer that is applied on top of the photoresist. An example of a bleachable main-chain polymer comprises polymers that are wholly, or at least partially composed of organo silicon compounds such as polysilanes having a structure:

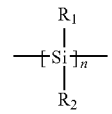

where $R_1$ and $R_2$ represent from 1 to about 10 carbon atom alkyl, fluoroalkyl, alicyclic or aromatic groups and various combinations thereof. The n can range anywhere from about 4 to about 10,000, or from about 50 to about 1000. Examples of these and other organo silicon based polymers useful in the invention comprise those described in U.S. Pat. Nos. 7,097,781; 7,008,749; 6,887,665; 6,770,417; 6,228,552; 6,054,254; 6,025,117; 4,871,646; 4,761,464 (also teaching organometallics comprising compounds having a polysilane copolymer backbone containing Ge, Sn, O and P); 4,588,801; and 4,587, 205. U.S. Pat. No. 6,887,665 cites two references in this regard; Hofer et al., "Contrast enhanced uv lithography with polysilanes," SPIE VOL. 469 Advances in Resist Technology 108-116 (1984), and West et al., "Contrast enhanced Photolithography: Application of Photobleaching Process in Microlithography" Journal of Imaging Science 30: 65-68 (1986). The following references also show polysilanes: U.S. Pat. Nos. 5,776,764; 5,391,442; 5,039,593; and 4,820,788. However, none of these addresses use of polysilanes with 193 nm light.

As a specific example, a polysilane compound was prepared and studied where $R_1$ was methyl and $R_2$ was cyclohexyl (designated CyMeSi). Another example is a compound where both $R_1$ and $R_2$ where n-hexyl (hex2Si). A change in the transmittance as a function of delivered dose is depicted in the FIGURE. As can be seen, the compounds progressively change their absorption properties during exposure to 193 nm light. They become more transparent.

Another example of the organic materials of the invention comprises polymers as noted before that are wholly or at least partially composed of aromatic hydroxyl and substituted aromatic hydroxyl compounds such as phenol, resorcinol, naphthol and the like reacted with a n organic carbonyl compound having from one to about five carbon atoms such as a ketone (e.g., acetone) or an aldehyde such as formaldehyde, and specifically include base catalyzed one-step and/or acid catalyzed two-step polymers. An example of a polymer suitable for the purposes of the invention comprises acid catalyzed phenol-formaldehyde polymers such as polymers from the novolak family and have the following structure:

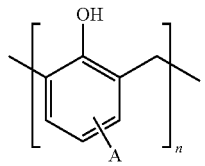

where A represents one or multiple hydrogens, or from 1 to about 10 carbon atom single or multiple alkyl, fluoroalkyl, alicyclic, aromatic, halogen, alkoxy, carbonyl, carboxyl and other heteroatom-containing groups (e.g. sulfonates) and combinations thereof. The following references describe polymers of this type i.e., those based on various hydroxy aromatic compounds such as phenol cresols and naphthols polymerized with a carbonyl compound such as formaldehyde. U.S. Pat. Nos. 6,887,665; 6,770,417; 6,228,552; 6,228, 552; 4,990,665; and 4,859,789.

An illustrative example of polymers of the invention having photobleachable side chains comprises polymers that are wholly or at least partially composed of polystyrene or acrylate families having the following structure:

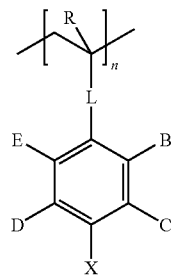

where X represents hydroxyl or a 1 to about 10 carbon alkoxy group and B, C, D, E represent hydrogen, alkyl, fluoroalkyl, alicyclic, aromatic, alkoxy and other heteroatom-containing groups, halogen, and combinations thereof, R represents hydrogen or a 1 to about 10 carbon alkyl group and L represents a group linking the aromatic ring to the polymer backbone. It can be no group at all resulting in derivatives of polystyrene or it can be a group such as carboxyl resulting in a phenolic ester of an acrylic polymer, or a 1 to about 3 carbon alkylene, or oxygen resulting in derivatives of polyvinylether. The following references describe various acrylates and/or styrene polymers and copolymers: U.S. Pat. Nos. 6,586,156 (acrylate or methacrylate silane polymers); 6,387,593; 6,228, 552; 4,990,665; and 4,859,789. Other styrene or acrylate polymers and/or copolymers suitable for the purpose of this invention comprise those described in U.S. Pat. Nos. 6,586, 156; 6,387,593; 6,228,552; 4,990,665; and 4,859,789.

In another aspect, the BMs of the invention are used as additives to the base polymer matrix of the top layer. The appropriate matrix polymer needs to be selected according to the MFR used. In one embodiment, the BMs are miscible with the polymer and the polymer itself is completely or partially transparent to the MFR. These polymers are also selected to form stable films with uniform optical properties. As an illustrative example, polyacrylate or polymethacrylate (such as polymethylmethacrylate) resins are used as the matrix polymers for 193 nm litho processes. These polymers may also comprise polyvinylalcohol or polyvinylether based polymers as well as other polymers transparent to MFR.

We also apply the CEL of the present invention comprising the cyclic compounds or organic compounds or combinations thereof such as CyMeSi or Hex2Si over the photoresist so that the cyclic compounds or organic compounds or combinations thereof simultaneously act as a CEL layer and a protection barrier or top antireflective coating or both, eliminating the need for additional top coats that are generally required especially in the case of current state-of-the-art immersion lithography schemes. This is included in the aspect of the invention referred to as operatively associating this CEL with the photoresist In another aspect, the bleachable moieties of the cyclic compounds or organic compounds or combinations thereof are directly incorporated into the photoresist eliminating the need to coat a separate CEL layer altogether. The cyclic compounds and organic compounds, and combinations thereof and other materials used with them of the present invention are physically mixed with the photoresist and/or polymerized into the photoresist. This is also included in the aspect of the invention referred to as operatively associating this CEL with the photoresist We also enhance the contrast of an aerial image in an optical lithography surface by operatively associating the surface with a cyclic compound or organic compound of the invention or combinations of such compounds. Operatively associating in this sense comprises forming a layer of the compound of the invention as described immediately above on an optical lithography surface or we form a mixture of such compound or compounds with the compound or composition employed to produce the optical lithography surface and form the mixture into a film. Where the components of the mixture include polymerizable groups, we form a polymeric combination of the components that make up the mixture.

We also provide a process for making a photolithographic material comprising operatively associating a contrast enhancement layer made of the cyclic compounds or organic compounds of the invention or combinations thereof with a photoresist material, where operatively associating the contrast enhancement layer with the photoresist material comprises the process described immediately above.

The compounds or compositions of the invention also include solvents such as glycol ethers; e.g., propylene glycol monomethyl ether acetate (PGMEA), toluene, and the like;

photoacid generators (PAGs) such as triphenylsulphonium triflate, diphenyliodonium triflate, bis-4-t-butylphenyl iodonium triflate, norbornene dicarboximidyl triflate, bis-4-t-butylphenyl iodonium perfluorooctane sulfonate and the like; photobase generators such as t-butoxy carbonyl (BOC) protected amines or carbamates; photodecomposable bases such as onium hydroxides; surfactants; crosslinkers such as Powder link™ or typical epoxy resin crosslinkers such as Heloxy™ brand materials, e.g. Heloxy™ 107.

The following sequence of steps comprises a method for practicing the invention:

Step 1: The materials are applied over the photoresist layer in any way known to those skilled in the art, including, but not limited to, spin-coating, spraying, dipping, evaporation, drop-casting and the like. In one embodiment, the resist in turn is applied over other underlying layers such as, but not limited to, antireflective and/or planarizing underlayers, Step 2: The film stack composed of (top-down) BM, photoresist, any other underlying film(s) is then processed further; two examples are baking and vacuum drying.

Step 3: The above mentioned processed film stack is exposed to the main fabrication radiation such as, but not limited to, light having wavelength of 193 nm. The exposure is effected either through a mask reticle typical for current optical lithography, or by a direct-write approach typical for electron beam lithography. The irradiation is selected to affect the particular photochemistry of the resist.

Step 4: The exposed film stack is processed as needed further but most preferably processed to recover the original opacity of the top layer where reversibly bleachable material (RBM) is used. (For irreversibly bleachable material go to Step 7). Such processing may involve, baking, exposure to chemicals in solution or vapors, gases, magnetic, electric or electromagnetic field, or radiation of a wavelength(s) or type(s) different from the main fabrication radiation. We select any single one or combination of these stimuli to completely or partially restore the opacity of the RBM to the main fabrication radiation. It can be effected by converting the transparent products back to species chemically identical to the original RBMs or to other products that are opaque to the main fabrication radiation but can be bleached by it again. As an example, it is thought that photomers of dianthryl derivatives can be converted to the parent dianthryl derivative by 193 nm light. The reverse reaction can be accomplished by irradiating with UV light of wavelengths above 300 nm thereby forming the photomer again restoring the initial high absorption, for example:

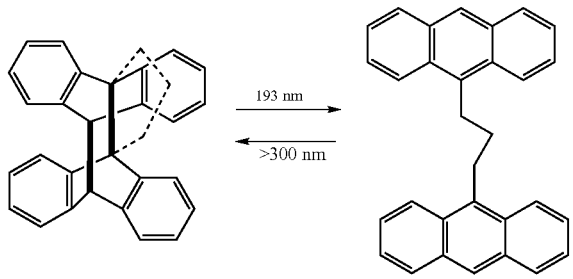

Step 5: The above steps are repeated in any sequence as needed for multiple exposure schemes as long as the RBM layer allows acceptable bleaching performance. The masks used for the exposures are repositioned as required or may comprise different masks altogether.

Step 6: When all the above steps are completed any additional processing is performed as needed, such as baking at a higher temperature(s).

Step 7: Subsequently, the top layer containing the BMs is removed in a separate processing step or it is removed during the development of the resist if employed.

Step 8: The resist is developed using conventional techniques to generate a relief.

Step 9: Other fabrication steps to produce a working device are applied as is typical in the semiconductor industry.

EXAMPLE 1

Synthesis of 2,3-dimesityl-2-butene 1-acetyl-2,4,6-trimethylbenzene (5 mmol, 832 µL) was added to a suspension of Zn (20 mmol, 1.3 g) in tetrahydrofuran (THF, 10 mL) under $N_2$ immersed in an ice bath followed by a toluene solution of $TiCl_4$ (10 mmol, 10 mL of 1M sol.). The reaction mixture was stirred 2 hour at ice-bath temperature and then refluxed for ca. 18 hours. After the reaction mixture had cooled to ambient, 10% aqueous solution of $K_2CO_3$ (ca 30 mL) was added and the solution was extracted twice with ether. Combine extract were washed with brine, dried over $MgSO_4$, filtered and evaporated. Chromatography with hexanes on silica gel afforded 250 mg of pure product.

EXAMPLE 2

Synthesis of a Spiropyrane Derivative

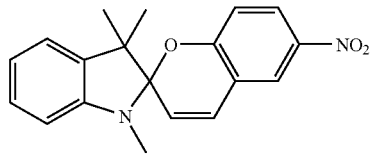

2-methylene-1,3,3-trimethylindoline (1.1 mmol, 194 µL) and 2-hydroxy-4-nitrobenzaldehyde (1 mmol, 167 mg) were combined in ethanol (5 mL) and refluxed for 4 hours. Then the solvent was evaporated and the residue chromatographed on silica gel with hexanes with increasing amount of ethyl acetate added (from 0 to 10%). Obtained was 115 mg of product.

EXAMPLE 3

Synthesis of 1,3-di(anthracene-9-yl)-1-propanone 9-anthraldehyde (10 mmol, 2.06 g) and 9-acetylanthracene (10 mmol, 2.2 g) were combined in dry DMF under $N_2$ and MeONa (28 mmol, 1.5 g) was added. The reaction mixture is stirred overnight. Then MeOH was added (60 mL) and the precipitate was filtered off and vacuum dried to afford 3.73 g of pure 1,3-di(anthracene-9-yl)-2-propene-1-one. Portion of it (2.5 mmol, 1 g) was suspended in a mixture of dioxane and MeOH (60 mL and 20 mL respectively) and heated to 75° C. at which point sodium borohydride (5.3 mmol, 200 mg) was added. The mixture was stirred for 5 min and 50 mL of water was added. After the mixture had cooled to ambient, the solids were filtered off, washed with water and vacuum dried affording 620 mg of the title product.

EXAMPLE 4

Synthesis of photomer of
1,3-di(anthracene-9-yl)-1-propanone

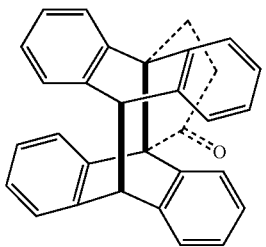

1,3-di(anthracene-9-yl)-1-propanone (150 mg) as prepared above was dissolved in benzene (175 mL) and irradiated for 30 min with 200 W high pressure Hg lamp that was surrounded by glass filter. Then the solvent was evaporated and the solid residue washed with ether and decanted twice. The solids were then recrystallized from hot mixture of benzene and hexanes. Obtained was 50 mg of pure photomer.

Throughout this specification, we have set out equivalents, such as equivalent elements, materials, compounds, compositions, conditions, processes, structures and the like, and even though set out individually, also include combinations of these equivalents such as the two component, three component, or four component combinations. Some of the equivalents of this specification are set out in groups, such as for example and not as a limitation the cyclic organic compounds and the organic compounds and described as including combinations thereof. Similarly by way of example and not as a limitation, various processing treatments are also set out as having equivalents with various parameters in each group and also noted as including combinations of other processing treatments. In all instances, combinations of equivalents set out in groups and combinations of processing treatments, includes without limitation the combination of various items or elements set out in each group or processing treatments as well as the combination of elements of one group with the elements of all or any one of the other groups.

Additionally, the various numerical ranges describing the invention as set forth throughout the specification also include any combination of the lower ends of the ranges with the higher ends of the ranges, and any single numerical value within a range, or any single numerical value within a range that will reduce the scope of the lower limits of the range or the scope of the higher limits of the range, or both the lower ends and the higher ends of the ranges, and ranges falling within any of these ranges.

The terms "about," or "substantial," or "substantially" as presently or subsequently applied to any parameters herein, such as a numerical value, including values used to describe numerical ranges, means slight variations in the parameter, or that which is largely or for the most part entirely specified. We also employ the terms "about," "substantial," and "substantially," in the same way as a person with ordinary skill in the art would understand them or employ them. In another embodiment, the terms "about," "substantial," or "substantially," when employed to define numerical parameters include, e.g., a variation up to five per-cent, up to ten per-cent, or up to 15 per-cent, or somewhat higher or lower than the upper limit of five per-cent, ten per-cent, or 15 per-cent. The term "up to" that defines numerical parameters means zero or a miniscule number, e.g. 0.001.

All scientific journal articles and other articles or text, as well as patents and patent applications that this written description mentions including the references additionally cited in such scientific journal articles and other articles, or text, and such patents and patent applications, are incorporated herein by reference in their entirety for the purpose cited in this written description, and for all other disclosures contained in such scientific journal articles and other articles or text, as well as patents and patent applications as all or any one or any combination may bear on or apply not only to this written description but also to this specification as a whole.

Although we have described our invention by reference to some embodiments, we do not intend that such embodiments should limit our invention, but that other embodiments encompassed by the doctrine of equivalents are intended to be included as falling within the broad scope and spirit of the foregoing written description, the Abstract of the Invention, the drawing, and the claims.

We claim as our invention:

1. A process for enhancing the contrast of an aerial image in an optical lithography surface comprising operatively associating said surface with a bleachable material and exposing said surface to light having a wavelength of 193 nm, where said bleachable material comprises:

(a) cyclic compounds having the following photoactive moieties that effect or change optical absorption or bleaching:

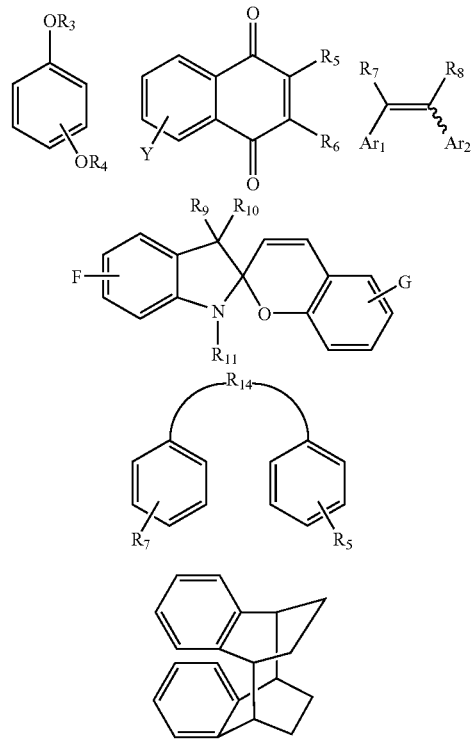

-continued

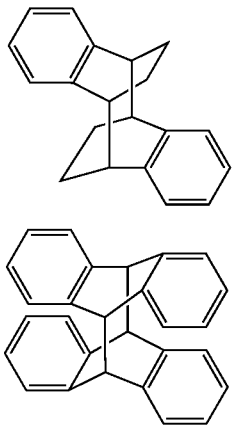

where Y represents organo or substituted organo moieties, $R_3$, $R_4$ comprise hydrogen, or 1 to about 10 carbon atom alkyl, fluoroalkyl, alicyclic, aromatic, carbonyl, carboxyl and other heteroatom-containing groups and combinations thereof; $R_5$, $R_6$, $R_7$, $R_8$, F, G comprise independently hydrogen, or 1 to about 10 carbon atom alkyl, fluoroalkyl, alicyclic, aromatic, alkoxyl, carbonyl, carboxyl, halogen and other heteroatom-containing groups comprising cyano or nitro groups and combinations thereof; $R_9$, $R_{10}$, $R_{11}$ comprise hydrogen, or 1 to about 10 carbon atom alkyl, fluoroalkyl, alicyclic and aromatic groups and various combinations thereof, $R_{14}$ represents any kind of tethering group that physically connects the two aromatic rings together; $Ar_1$ and $Ar_2$ comprise 6 to about 10 carbon atom aromatic substituents including substituted or unsubstituted phenyl or thienyl arranged in cis or trans geometry around the central double bond; $R_5$ and $R_6$, $R_7$ and $R_8$ also comprising a cyclic structure annulated to the base structure depicted in the corresponding formula; structures I, II, and III comprise basic skeletons and can be substituted in any available positions with any one or combinations of $R_3$ to $R_{14}$ multiple substituents;

(b) organo silicon compounds (c) condensation products of aromatic hydroxyl compounds and a carbonyl compound; and (d) compounds with pendant photobleachable moieties comprising styrene and phenolic acrylates.

2. The process of claim 1 where said bleachable material comprises an organic or an organometallic polymer that can be bleached with light having wavelength of 193 nm, said polymer having the photoactive moieties responsible for bleaching as a part of the main chain and selected from polysilane and novolak type phenol-formaldehyde structures comprising:

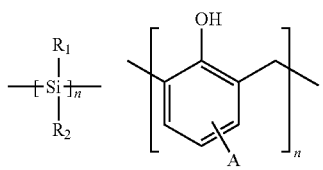

where $R_1$ and $R_2$ represent 1 to about 10 carbon alkyl, fluoroalkyl, alicyclic or aromatic groups and combinations thereof and where "n" has a value of about 3 to about 10,000, wherein A represents one or several hydrogen, hydroxyl, or 1 to about 10 carbon atom alkyl, fluoroalkyl, alicyclic, aromatic, alkoxy, carbonyl, carboxyl and other heteroatom-containing groups, halogen, and combinations thereof.

3. The process of claim 1 where said bleachable material comprises an organic or an organometallic polymer that can be bleached with light having wavelength of 193 nm, said polymers including photoactive moieties as pendant moieties to the main polymer backbone following basic structures comprising:

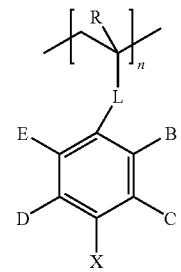

where X represents hydroxyl or a 1 to about 10 carbon alkoxy group and B,C,D,E represent hydrogen, alkyl, fluoroalkyl, alicyclic, aromatic, alkoxy and other heteroatom-containing groups, halogen, and combinations thereof, R represents hydrogen or a 1 to about 10 carbon alkyl group and L comprises an optional group and when present represents a group linking the aromatic ring to the polymer backbone resulting in derivatives of polystyrene or a carboxyl group resulting in a phenolic ester of an acrylic polymer, or a 1 to about 3 carbon alkylene, or oxygen resulting in derivatives of polyvinyl ether.

4. The process of claim 1 wherein said photoactive moieties can be bleached reversibly to regain at least part or all of the initial opacity to light of wavelength of 193 nm.

5. The process of claim 2 wherein said photoactive moieties comprising

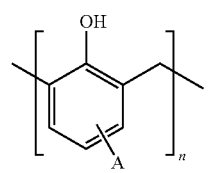

can be bleached reversibly to regain at least part or all of the initial opacity to light of wavelength of 193 nm.

6. The process of claim 3 wherein said photoactive moieties can be bleached reversibly to regain at least part or all of the initial opacity to light of wavelength of 193 nm.

7. The process of claim 1 where said surface comprises at least one of a top coat protective barrier for an immersion lithography process, an antireflective coating, or a surface that simultaneously acts as both a top coat protective barrier and an antireflective coating.

8. The process of claim 2 where said surface comprises at least one of a top coat protective barrier for an immersion lithography process, an antireflective coating, or a surface that simultaneously acts as both a top coat protective barrier and an antireflective coating.

9. The process of claim 3 where said surface comprises at least one of a top coat protective barrier for an immersion lithography process, an antireflective coating, or a surface that simultaneously acts as both a top coat protective barrier and an antireflective coating.

10. A polymer prepared from monomers comprising a bleachable material where said bleachable material comprises:
(a) cyclic compounds having the following photoactive moieties that effect or change optical absorption or bleaching:

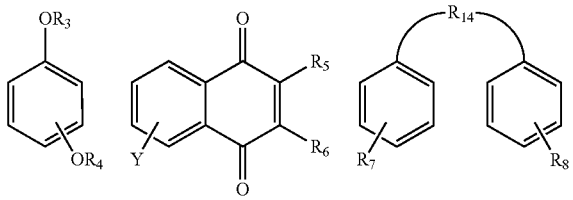

I

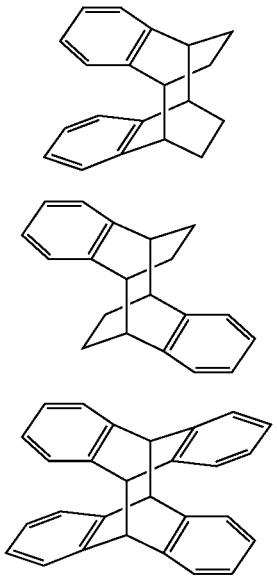

II

III where Y represents organo or substituted organo moieties, $R_3$, $R_4$ comprise hydrogen, or 1 to about 10 carbon atom alkyl, fluoroalkyl, alicyclic, aromatic, carbonyl, carboxyl and other heteroatom-containing groups and combinations thereof; $R_5$, $R_6$, R7, and R8 comprise independently hydrogen, or 1 to about 10 carbon atom alkyl, fluoroalkyl, alicyclic, aromatic, alkoxyl, carbonyl, carboxyl, halogen and other heteroatom-containing groups comprising cyano or nitro groups and combinations thereof; $R_{14}$ represents any kind of tethering group that physically connects the two aromatic rings together; $R_5$ and $R_6$ R7 and R8, also comprising a cyclic structure annulated to the base structure depicted in the corresponding formula; structures I, II, and III comprise basic skeletons and can be substituted in any available positions with any one or combinations of $R_3$ to $R_{14}$ multiple substituents;
(b) organo silicon compounds
(c) condensation products of aromatic hydroxyl compounds and a carbonyl compound; and
(d) compounds with pendant photobleachable moieties comprising styrene and phenolic acrylates,
where the said photoactive moieties are an integral part of a monomer.

11. A composition comprising the polymer of claim 10 that can be bleached with 193 nm light further comprising a photoinactive polymer that does not change its optical properties during exposure with 193 nm light.

12. A bleachable material composition comprising an organic or an organometallic polymer that can be bleached with light having a wavelength of 193 nm, said polymer having the photoactive moieties responsible for bleaching as a part of the main chain and selected from polysilane and novolak type phenol-formaldehyde structures comprising:

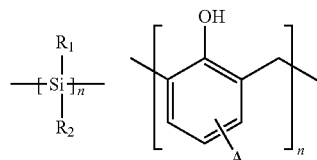

where $R_1$ and $R_2$ represent 1 to about 10 carbon alkyl, fluoroalkyl, alicyclic or aromatic groups and combinations thereof and where "n" has a value of about 3 to about 10,000, wherein A represents one or several hydrogen, hydroxyl, or 1 to about 10 carbon atom alkyl, fluoroalkyl, alicyclic, aromatic, alkoxy, carbonyl, carboxyl and other heteroatom-containing groups, halogen, and combinations thereof, and
further comprising a photoinactive polymer that does not change its optical properties during exposure with 193 nm light.

13. A bleachable material composition comprising an organic or an organometallic polymer that can be bleached with light having a wavelength of 193 nm, said polymers having photoactive moieties as pendant moieties to the main polymer backbone and comprising the following basic structures:

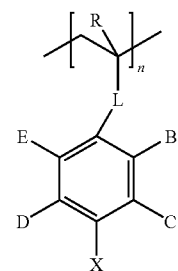

where X represents hydroxyl or a 1 to about 10 carbon alkoxy group and B,C,D,E represent hydrogen, alkyl, fluoroalkyl, alicyclic, aromatic, alkoxy and other heteroatom-containing groups, halogen, and combinations thereof, R represents hydrogen or a 1 to about 10 carbon alkyl group and L comprises an optional group and when present represents a group linking the aromatic ring to the polymer backbone resulting in derivatives of polystyrene or a carboxyl group resulting in a phenolic ester of an acrylic polymer, or a 1 to about 3 carbon alkylene, or oxygen resulting in derivatives of polyvinyl ether,
further comprising a photoinactive polymer that does not change its optical properties during exposure with 193 nm light.

14. The process of claim 1, further comprising solvents, photobase generators, photodecomposable bases, surfactants, crosslinkers, and/or combinations thereof.

15. The process of claim 2 further comprising solvents, photobase generators, photodecomposable bases, surfactants, crosslinkers, and/or combinations thereof.

16. The process of claim 3 further comprising solvents, photobase generators, photodecomposable bases, surfactants, crosslinkers, and/or combinations thereof.

17. A photolithographic article of manufacture comprising a contrast enhancement layer operatively associated with a photoresist layer, where said contrast enhancement layer comprises a bleachable material comprising:
(a) cyclic compounds having the following photoactive moieties that effect or change optical absorption or bleaching:

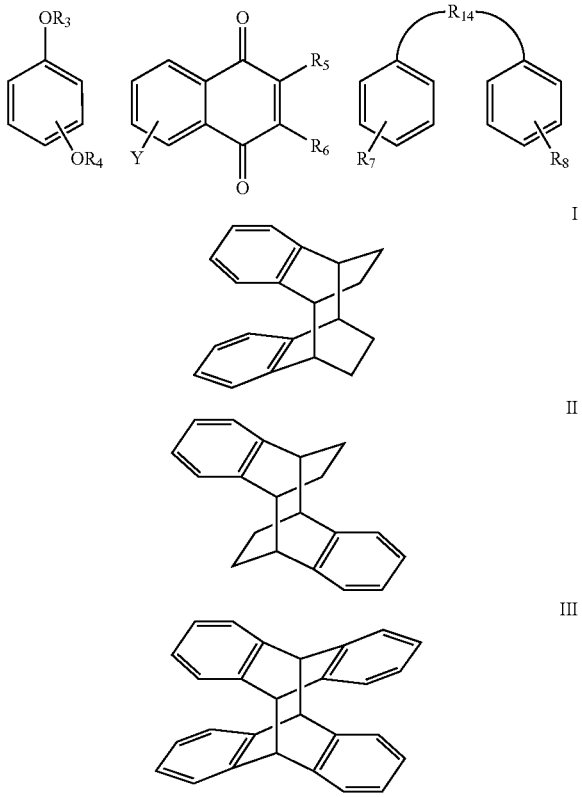

where Y represents organo or substituted organo moieties, $R_3$, $R_4$ comprise hydrogen, or 1 to about 10 carbon atom alkyl, fluoroalkyl, alicyclic, aromatic, carbonyl, carboxyl and other heteroatom-containing groups and combinations thereof; $R_5$, $R_6$, R7, and R8 comprise independently hydrogen, or 1 to about 10 carbon atom alkyl, fluoroalkyl, alicyclic, aromatic, alkoxyl, carbonyl, carboxyl, halogen and other heteroatom-containing groups comprising cyano or nitro groups and combinations thereof; $R_{14}$ represents any kind of tethering group that physically connects the two aromatic rings together; $R_5$ and $R_6$, R7, and R8 also comprising a cyclic structure annulated to the base structure depicted in the corresponding formula; structures I, II, and III comprise basic skeletons and can be substituted in any available positions with any one or combinations of $R_3$ to $R_{14}$ multiple substituents;
(b) organo silicon compounds
(c) condensation products of aromatic hydroxyl compounds and a carbonyl compound; and
(d) compounds with pendant photobleachable moieties comprising styrene and phenolic acrylates.

18. A photolithographic article of manufacture comprising a contrast enhancement layer operatively associated with a photoresist layer, where said contrast enhancement layer comprises a bleachable material comprising:
an organic or an organometallic polymer that can be bleached with light having wavelength of 193 nm, said polymer having the photoactive moieties responsible for bleaching as a part of the main chain and selected from polysilane and novolak type phenol-formaldehyde structures comprising:

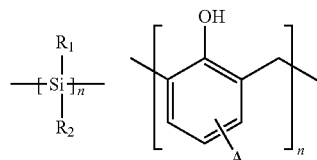

where $R_1$ and $R_2$ represent 1 to about 10 carbon alkyl, fluoroalkyl, alicyclic or aromatic groups and combinations thereof and where "n" has a value of about 3 to about 10,000, wherein A represents one or several hydrogen, hydroxyl, or 1 to about 10 carbon atom alkyl, fluoroalkyl, alicyclic, aromatic, alkoxy, carbonyl, carboxyl and other heteroatom-containinq groups, halogen, and combinations thereof.

19. A photolithographic article of manufacture comprising a contrast enhancement layer operatively associated with a photoresist layer, where said contrast enhancement layer comprises a bleachable material comprising:
an organic or an organometallic polymer that can be bleached with light having wavelength of 193 nm, said polymers including photoactive moieties as pendant moieties to the main polymer backbone following basic structures comprising:

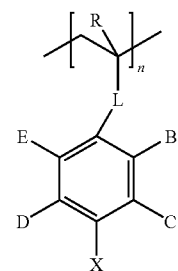

where X represents hydroxyl or a 1 to about 10 carbon alkoxy group and B,C,D,E represent hydrogen, alkyl, fluoroalkyl, alicyclic, aromatic, alkoxy and other heteroatom-containing groups, halogen, and combinations thereof, R represents hydrogen or a 1 to about 10 carbon alkyl group and L comprises an optional group and when present represents a group linking the aromatic ring to the polymer backbone resulting in derivatives of polystyrene or a carboxyl group resulting in a phenolic ester of an acrylic polymer, or a 1 to about 3 carbon alkylene, or oxygen resulting in derivatives of polyvinyl ether.

20. The article of manufacture of claim 17 wherein said bleachable material comprises a reversibly bleachable contrast enhancement compound.

21. The article of manufacture of claim 18 wherein said bleachable material comprises a reversibly bleachable contrast enhancement compound.

22. The article of manufacture of claim 19 wherein said bleachable material comprises a reversibly bleachable contrast enhancement compound.

23. A process comprising forming high density features in a photoresist film comprising exposing with 193 nm light a stack of irreversibly bleachable CELs based on the compound

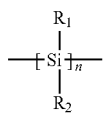

positioned over a conventional photoresist, where $R_1$ and $R_2$ represent 1 to about 10 carbon alkyl, fluoroalkyl, alicyclic or aromatic groups and combinations thereof and where "n" has a value of about 3 to about 10,000.

24. A process comprising forming high density features in a photoresist film comprising multiple exposures with 193 nm light of a stack comprising a CEL based on a reversibly bleachable compound positioned over a conventional photoresist, wherein said compound comprises bleachable materials comprising:
  (a) cyclic compounds having the following photoactive moieties that effect or change optical absorption or bleaching:

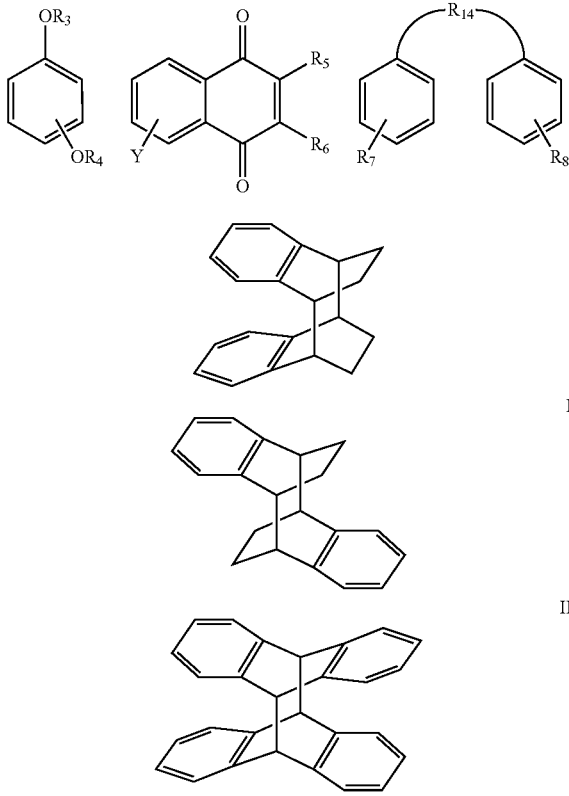

where Y represents organo or substituted organo moieties, $R_3$, $R_4$ comprise hydrogen or 1 to about 10 carbon atom alkyl, fluoroalkyl, alicyclic, aromatic, carbonyl, carboxyl and other heteroatom-containing groups and combinations thereof; $R_5$, $R_6$, R7, and R8 comprise independently hydrogen, or 1 to about 10 carbon atom alkyl, fluoroalkyl, alicyclic, aromatic, alkoxyl, carbonyl, carboxyl, halogen and other heteroatom-containing groups comprising cyano or nitro groups and combinations thereof; $R_{14}$ represents any kind of tethering groups that physically connects the two aromatic rings together; $R_5$ and $R_6$, R7 and R8 also comprising a cyclic structure annulated to the base structure depicted in the corresponding formula; structures I, II, and III comprise basic skeletons and can be substituted in any available positions with any one or combinations of $R_3$ to $R_{14}$ multiple substituents;
  (b) organo silicon compounds
  (c) condensation products of aromatic hydroxyl compounds and a carbonyl compound; and
  (d) compounds with pendant photobleachable moieties comprising styrene and phenolic acrylates.

25. A process comprising forming high density features in a photoresist film comprising multiple exposures with 193 nm light of a stack comprising a CEL based on a reversibly bleachable compound positioned over a conventional photoresist, wherein said compound comprises bleachable materials comprising:
  an organic or an organometallic polymer that can be bleached with light having wavelength of 193 nm, said polymer having the photoactive moieties responsible for bleaching as a part of the main chain and selected from polysilane and novolak type phenol-formaldehyde structures comprising:

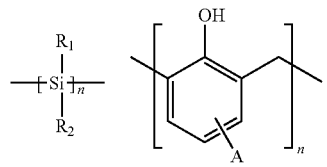

where $R_1$ and $R_2$ represent 1 to about 10 carbon alkyl, fluoroalk, alicyclic or aromatic groups, and combinations thereof and where "n" has a value of about 3 to about 10,000, wherein A represents one or several hydrogen, hydroxyl, or 1 to about 10 carbon atom alkyl, fluoroalkyl, alicyclic, aromatic, alkoxy, carbonyl, carboxyl and other heteroatom-containing groups, halogen, and combinations thereof.

26. A process comprising forming high density features in a photoresist film comprising multiple exposures with 193 nm light of a stack comprising a CEL based on a reversibly bleachable compound positioned over a conventional photoresist, wherein said compound comprises bleachable materials comprising:
  an organic or an organometallic polymer that can be bleached with light having wavelength of 193 nm, said polymers including photoactive moieties as pendant moieties to the main polymer backbone following basic structures comprising:

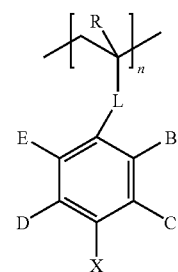

where X represents hydroxyl or a 1 to about 10 carbon alkoxy group and B,C,D,E represent hydrogen, alkyl, fluoroalkyl, alicyclic, aromatic, alkoxy and other heteroatom-containing groups, halogen, and combinations thereof, R represents hydrogen or a 1 to about 10 carbon alkyl group and L comprises an optional group and when present represents a group linking the aromatic ring to the polymer backbone resulting in derivatives of polystyrene or a carboxyl group resulting in a phenolic ester of an acrylic polymer, or a 1 to about 3 carbon alkylene, or oxygen resulting in derivatives of polyvinyl ether.

* * * * *